(12) United States Patent
Dinega et al.

(10) Patent No.: US 9,303,187 B2
(45) Date of Patent: Apr. 5, 2016

(54) COMPOSITIONS AND METHODS FOR CMP OF SILICON OXIDE, SILICON NITRIDE, AND POLYSILICON MATERIALS

(71) Applicant: Cabot Microelectronics Corporation, Aurora, IL (US)

(72) Inventors: Dimitry Dinega, Aurora, IL (US); Kevin Moeggenborg, Midland, MI (US); William Ward, Glen Ellyn, IL (US); Daniel Mateja, Oswego, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 93 days.

(21) Appl. No.: 13/947,449

(22) Filed: Jul. 22, 2013

(65) Prior Publication Data

US 2015/0024595 A1    Jan. 22, 2015

(51) Int. Cl.
| H01L 21/304 | (2006.01) |
| C09G 1/02 | (2006.01) |
| H01L 21/306 | (2006.01) |
| C09G 1/00 | (2006.01) |
| C09G 1/04 | (2006.01) |
| C09K 13/06 | (2006.01) |
| C09K 3/14 | (2006.01) |
| B24B 1/00 | (2006.01) |
| H01L 21/3105 | (2006.01) |
| H01L 21/321 | (2006.01) |

(52) U.S. Cl.
CPC ... *C09G 1/02* (2013.01); *B24B 1/00* (2013.01); *C09G 1/00* (2013.01); *C09G 1/04* (2013.01); *C09K 3/1463* (2013.01); *C09K 13/06* (2013.01); *H01L 21/30625* (2013.01); *H01L 21/31053* (2013.01); *H01L 21/3212* (2013.01)

(58) Field of Classification Search
CPC .................... H01L 21/3212; H01L 21/30625; H01L 2224/11616; C09G 1/00; C09G 1/02; C09G 1/04; C09G 1/06; C09K 13/06; C09K 3/1463; C09K 3/1409; B81C 2201/0104; B24B 1/00

See application file for complete search history.

(56) References Cited

U.S. PATENT DOCUMENTS

| 6,626,968 | B2 | 9/2003 | Park et al. |
| 7,531,105 | B2 | 5/2009 | Dysard et al. |
| 7,582,127 | B2 | 9/2009 | Vacassy et al. |
| 2006/0108326 | A1* | 5/2006 | Dysard et al. .................... 216/88 |
| 2009/0056231 | A1 | 3/2009 | White et al. |
| 2009/0090696 | A1 | 4/2009 | White et al. |
| 2012/0094489 | A1 | 4/2012 | Moeggenborg et al. |

* cited by examiner

*Primary Examiner* — Jiong-Ping Lu
(74) *Attorney, Agent, or Firm* — Thomas Omholt; Arlene Hornilla

(57) ABSTRACT

The present invention provides a chemical mechanical polishing method for polishing a substrate comprising silicon dioxide, silicon nitride, and polysilicon. The method comprises abrading a surface of the substrate with a CMP composition to remove at least some silicon dioxide, silicon nitride and polysilicon therefrom. The CMP composition comprising a particulate ceria abrasive suspended in an aqueous carrier having a pH of about 3 to 9.5 and containing a cationic polymer; wherein the cationic polymer consists of a quaternary methacryloyloxyalkylammonium polymer.

7 Claims, 5 Drawing Sheets

PolyMADQUAT    1

Poly(acrylamide-MADQUAT)    4

3

2

5

PolyDADMAC

6

Poly(acrylamide-DADMAC)

COMPOSITIONS AND METHODS FOR CMP OF SILICON OXIDE, SILICON NITRIDE, AND POLYSILICON MATERIALS

FIELD OF THE INVENTION

This invention relates to polishing compositions and methods. More particularly, this invention relates to methods for polishing substrates containing silicon oxide, silicon nitride and/or polysilicon and compositions therefor.

BACKGROUND

Typical solid state memory devices (dynamic random access memory (DRAM), static random access memory (SRAM), erasable programmable read only memory (EPROM), and electrically erasable programmable read only memory (EEPROM)) employ micro-electronic circuit elements for each memory bit in memory applications. For typical non-volatile memory elements (like EEPROM, i.e., "flash" memory), floating gate field effect transistors are employed as the data storage device. These devices hold a charge on the gate of the field effect transistor to store each memory bit and have limited re-programmability. They are also slow to program.

During semiconductor and memory device manufacture, various layers of materials must be removed or reduced in order to form the various components of the circuits on the wafer, which typically is achieved by chemical-mechanical polishing (CMP). Many traditional CMP compositions are selective for removal of one type of integrated circuit component relative to another component.

Compositions and methods for CMP of the surface of a substrate are well known in the art. Polishing compositions (also known as polishing slurries, CMP slurries, and CMP compositions) for CMP of surfaces of semiconductor substrates (e.g., for integrated circuit manufacture) typically contain an abrasive, various additive compounds, and the like.

In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing agents, acids, bases, or other additives present in the CMP composition) and/or the mechanical activity of an abrasive suspended in the polishing composition. Typical abrasive materials include silicon dioxide, cerium oxide, aluminum oxide, zirconium oxide, and tin oxide.

Flash memory devices with 3-dimensional transistor stacking (3D flash memory) are increasingly popular. Polishing slurries for 3D flash applications generally should provide relatively high removal rates for silicon oxide (e.g., plasma-enhanced tetraethylorthosilicate-derived silicon dioxide, also known as "PETEOS" or "TEOS"), silicon nitride, and polysilicon, as well as good surface topography (e.g., dishing less than about 50 Å) and low defect levels (e.g., less than about 50 defects-per-wafer). Such a combination of features typically is not found in existing CMP compositions or methods. Consequently, there is an ongoing need to develop new polishing methods and compositions that provide such beneficial properties. The present invention addresses this ongoing need. These and other advantages of the invention, as well as additional inventive features, will be apparent from the description of the invention provided herein.

SUMMARY

The present invention provides a chemical mechanical polishing method for polishing a substrate comprising silicon dioxide, silicon nitride, and/or polysilicon. The removal rates for silicon dioxide, silicon nitride, and polysilicon achievable with the methods described herein are high, e.g., typically greater than 1000 Angstroms-per-minute (Å/min) for each of the three materials, which is beneficial for 3D flash memory manufacture. In a preferred embodiment, the method comprises abrading a surface of the substrate with a CMP composition to remove at least some silicon dioxide, silicon nitride and polysilicon therefrom. The CMP composition comprises, consists essentially of, or consists of a particulate ceria abrasive (e.g., colloidal ceria) suspended in an aqueous carrier having a pH in the range of about 3 to about 9.5 (preferably about 3 to 5) and containing a cationic polymer. The cationic polymer consists of a quaternary methacryloyloxyalkyl ammonium polymer, such as a 2-methacryloyloxyethyl trimethyl ammonium polymer, e.g., a poly(2-methacryloyloxyethyltrimethyl ammonium chloride), also referred to herein as "polyMADQUAT", and similar materials. At point of use, the ceria abrasive preferably is present in the CMP composition at a concentration of about 0.1 to about 2 percent by weight (wt %), and the cationic polymer preferably is present in the CMP composition at a concentration of about 20 to about 200 parts-per-million (ppm). Preferably, the particulate ceria abrasive has a mean particle size of about 10 to about 200 nm, e.g., about 60 nm for primary abrasive particles. The quaternary 2-methacryloyloxyalkyl ammonium polymer preferably is the sole cationic polymer utilized in the compositions and methods described herein. Optionally, a water soluble salt such as ammonium nitrate, a biocide, a pH buffering agent, and the like may be included in the composition.

In a preferred embodiment, the abrading is performed in a CMP polishing apparatus in conjunction with a polishing pad.

In another aspect, the present invention provides a CMP composition (slurry) useful for polishing substrates that include a silicon oxide, silicon nitride, and/or polysilicon (doped or undoped) component. The CMP slurry has a pH of about 3 to about 9.5 and comprises, consists essentially of, or consists of a particulate ceria abrasive suspended in an aqueous carrier containing the cationic polymer as described above with respect to the polishing method aspect. The ceria abrasive (e.g., colloidal ceria) preferably is present in the composition at a concentration of about 0.1 to about 4 wt %. The cationic polymer of the CMP composition preferably is present in the CMP composition at a concentration of about 20 to about 800 ppm. In use, the composition can be diluted, if necessary, with water or another suitable aqueous carrier so that the concentration of the ceria preferably is about 0.1 to about 1 wt % and the concentration of the cationic polymer is about 20 to about 200 ppm, at point of use.

In one embodiment, the CMP composition comprises, consists essentially of or consists of about 1.2 to about 2 wt % of the particulate colloidal ceria abrasive suspended in an aqueous carrier containing about 150 to about 200 ppm of the cationic polymer; wherein the cationic polymer consists of poly(2-methacryloyloxyethyltrimethyl ammonium chloride), and the composition has a pH in the range of about 3 to 5. Optionally, a water soluble salt such as ammonium nitrate, a biocide, a pH buffering agent, and the like may be included in the composition.

The compositions and methods described herein are particularly useful in 3D flash memory polishing application, and advantageously provide unexpectedly high removal rates (e.g., >1000 Å/min) for silicon oxide, silicon nitride and polysilicon.

DETAILED DESCRIPTION OF EXEMPLARY EMBODIMENTS

Figure 1:
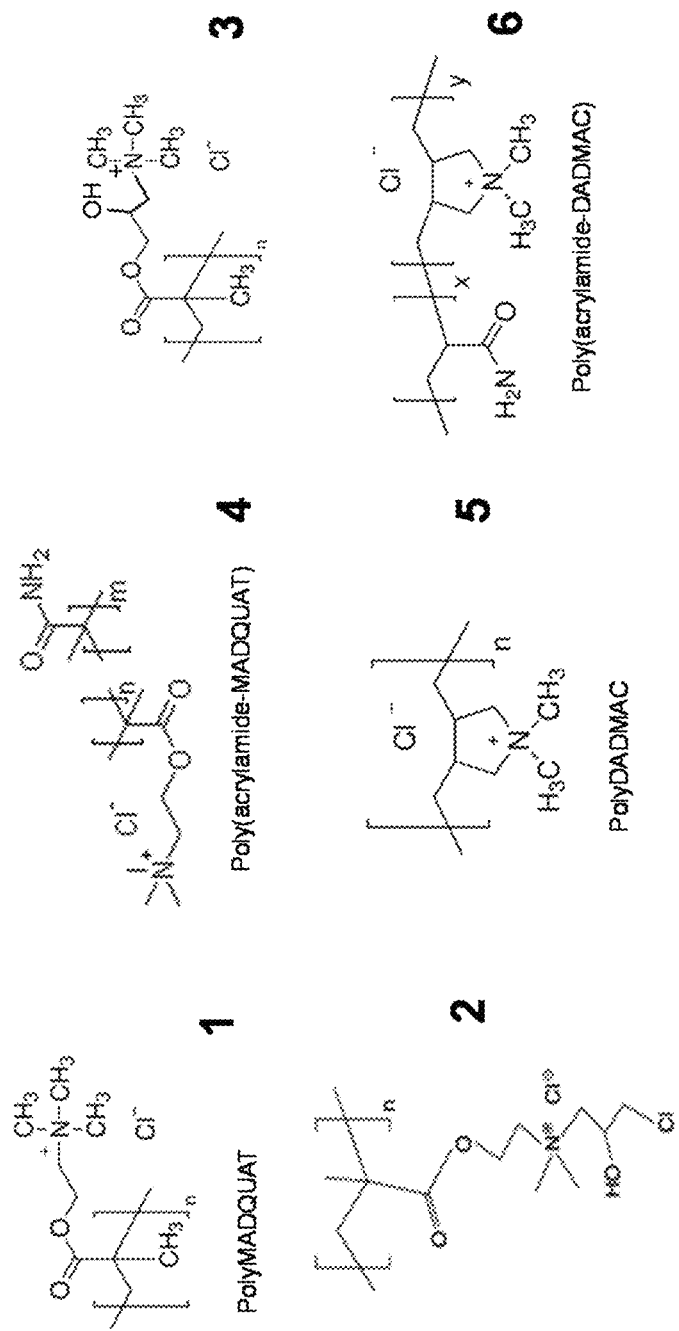
FIG. 1 provides formulae of selected cationic polymers evaluated in the compositions and methods of the present invention.

The present invention provides methods and compositions suitable for polishing substrates that comprise one or more of silicon oxide (e.g., TEOS), silicon nitride, and polysilicon. In particular, the compositions utilized in the methods described herein comprise a combination of a particulate ceria abrasive and a quaternary methacryloyloxyalkyl ammonium polymer, e.g., a MADQUAT homopolymer and the like, preferably as the sole cationic polymer in the composition. This unique combination of materials provides for the desired high removal rates for oxide, nitride and polysilicon, which make the compositions and methods useful for 3D flash memory polishing application, for example. Other cationic polymers besides quaternary methacryloyloxyalkyl ammonium polymers were evaluated, but provided results, such as over-suppression of the oxide removal rate or insufficient enhancement of the nitride and polysilicon removal rates, which were not desirable for 3D flash memory polishing applications.

The compositions of the present invention preferably have a pH of about 3 to about 9.5 (more preferably a pH of about 3 to about 5, e.g., about 4 to 5). The pH of the composition can be achieved and/or maintained by inclusion of a buffering material including an acidic component, which can be any inorganic or organic acid. In some preferred embodiments, the acidic component can be an inorganic acid, a carboxylic acid, an organophosphonic acid, an acidic heterocyclic compound, a salt thereof, or a combination of two or more of the foregoing. Non-limiting examples of suitable inorganic acids include hydrochloric acid, sulfuric acid, phosphoric acid, phosphorous acid, pyrophosphoric acid, sulfurous acid, and tetraboric acid, or any acidic salt thereof. Non-limiting examples of suitable carboxylic acids include, monocarboxylic acids (e.g., acetic acid, benzoic acid, phenylacetic acid, 1-naphthoic acid, 2-naphthoic acid, glycolic acid, formic acid, lactic acid, mandelic acid, and the like), and polycarboxylic acids (e.g., oxalic acid, malonic acid, succinic acid, adipic acid, tartaric acid, citric acid, maleic acid, fumaric acid, aspartic acid, glutamic acid, phthalic acid, isophthalic acid, terephthalic acid, 1,2,3,4-butanetetracarboxylic acid, itaconic acid, and the like), or any acidic salt thereof. Non-limiting examples of suitable organic phosphonic acids include phosphonoacetic acid, iminodi(methylphosphonic acid), DEQUEST® 2000LC brand amino-tri(methylenephosphonic acid), and DEQUEST® 2010 brand hydroxyethylidene-1,1-diphosphonic acid, both of which are available from Solutia, or any acidic salt thereof. Non-limiting examples of suitable acidic heterocyclic compounds include uric acid, ascorbic acid, and the like, or any acidic salt thereof. In some embodiments, the desired pH can be achieved and maintained with no buffer, with only a relatively small amount of buffer, or by simple pH adjustment with an acid or base.

The polishing compositions of the invention optionally also can include suitable amounts of one or more other additive materials commonly included in polishing compositions, such as metal complexing agents, corrosion inhibitors, viscosity modifying agents, biocides, and the like. For example, the composition can include a buffer such as histidine or bis-tris; a biocide such as KATHON or NEOLONE biocides; a complexing agent such as acetic acid, histidine, lysine, glycine, picolinic acid, tartaric acid, iminodiacetic acid, alanine, benzoic acid, nitrilotriacetic acid (NTA), glutamic acid, glutaric acid, beta-alanine, aspartic acid, ornithine, or proline; a corrosion inhibitor such as benzotriazole (BTA), 1,2,3-triazole, 1,2,4-triazole, a tetrazole, 5-aminotetrazole, 3-amino-1,2,4-triazole, phenylphosphonic acid, methylphosphonic acid; and the like.

The aqueous carrier can be any aqueous solvent, e.g., water, aqueous methanol, aqueous ethanol, a combination thereof, and the like. Preferably, the aqueous carrier comprises predominately deionized water.

The ceria abrasive component of the CMP compositions described herein can be any particulate ceria abrasive useful for semiconductor polishing applications. In some preferred embodiments, the ceria abrasive is a colloidal ceria. Preferably, the ceria abrasive comprises primary ceria particles having a mean particle size of about 10 to about 200 nm, more preferably about 40 to 80 nm (e.g., about 60 nm). The ceria abrasive also can include secondary ceria particles having a larger particle size (e.g., about 150 to about 170 nm).

The cationic polymer component of the CMP compositions is a quaternary methacryloyloxyalkyl ammonium polymer such as a methacryloyloxyethyltrimethyl ammonium homopolymer, (e.g., polyMADQUAT, shown as Polymer 1 is FIG. 1), a 3-methacryloyloxy-2-hydroxypropyltrimethyl ammonium homopolymer (e.g., Polymer 3, also known as poly(2-hydroxy-3-methacryloxypropyltrimethyl ammonium chloride), shown in FIG. 1), a 2-methacryloyloxyethyl-N,N-dimethyl-N-(2-hydroxy-3-chloropropyl) ammonium homopolymer (e.g., Polymer 2, also known as poly(3-chloro-2-hydroxypropyl-2-methacryloxyethyldimethyl ammonium chloride), shown in FIG. 1), or a combination of two or more of the foregoing. In a preferred embodiment, the cationic polymer is polyMADQUAT, i.e., poly(2-methacryloyloxyethyltrimethyl ammonium chloride). The counter-ion for the ammonium groups of the cationic polymer can be any anion, such as a halide (e.g., chloride), a nitrate, a methylsulfate, or a combination of two or more such anions. The cationic polymer, particularly polyMADQUAT, preferably has a molecular weight in the range of about 10000 to about 25000, more preferably about 12000 to about 16000.

Optionally, the CMP composition can include a water soluble salt, such as ammonium nitrate for profile control and conductivity. For example, the composition can include about 50 to about 2000 ppm of the water soluble salt. In the absence of the salt, the Oxide removal rate can be considerably greater (e.g., 2 or more times) the removal rate for nitride and/or polysilicon; addition of the salt tends to bring the oxide removal rate down to a value similar to the removal rates for nitride and polysilicon.

The polishing compositions used in the methods described herein can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, polymer, chelating agents, buffers, and the like), as well as any combination of ingredients. For example, the ceria abrasive can be dispersed in water, combined with the polymer components, and mixed by any method that is capable of incorporating the components into the polishing composition. Typically, an oxidizing agent, when utilized, is not added to the polishing composition until the composition is ready for use in a CMP process, for example, the oxidizing agent can be added just prior to initiation of polishing. The pH can be further adjusted at any suitable time by addition of an acid or base, as needed.

The polishing compositions of the present invention also can be provided as a concentrate, which is intended to be diluted with an appropriate amount of aqueous solvent (e.g., water) prior to use. In such an embodiment, the polishing composition concentrate can include the various components dispersed or dissolved in aqueous solvent in amounts such that, upon dilution of the concentrate with an appropriate amount of aqueous solvent, each component of the polishing composition will be present in the polishing composition in an amount within the appropriate range for use.

The compositions and methods of the invention surprisingly provide useful and high oxide, nitride, and polysilicon removal rates under typical CMP conditions. As used herein, the term polysilicon is intended to encompass both undoped and doped polysilicon (e.g., phosphorous (P) or boron (B) doped polysilicon).

The CMP methods of the invention preferably are achieved using a chemical-mechanical polishing apparatus. Typically, the CMP apparatus comprises a platen, which, when in use, is in motion and has a velocity that results from orbital, linear, and/or circular motion, a polishing pad in contact with the platen and moving relative to the platen when in motion, and a carrier that holds a substrate to be polished by contacting and moving relative to the surface of the polishing pad. The polishing of the substrate takes place by the substrate being placed in contact with the polishing pad and a polishing composition of the invention and then moving the polishing pad relative to the substrate, so as to abrade at least a portion of the substrate to polish the substrate.

The following examples further illustrate certain aspects of the invention but, of course, should not be construed as in any way limiting its scope. As used herein and in the following examples and claims, concentrations reported as parts-per-million (ppm) or percent by weight (wt %) are based on the weight of the active component of interest divided by the weight of the composition.

EXAMPLE 1

This example illustrates the effect of various cationic polymers on oxide, nitride and polysilicon removal rates in ceria-based CMP polishing compositions.

Figure 2:
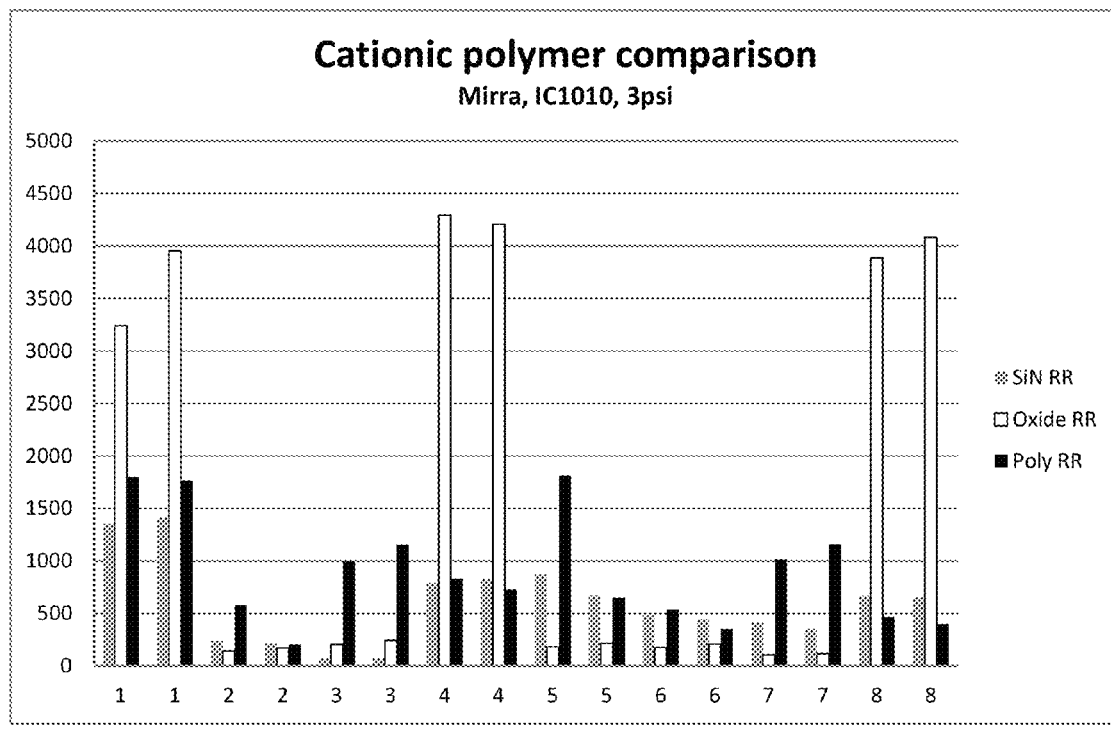
FIG. 2 provides a graph of removal rates (RR) for polishing of oxide, nitride and polysilicon blanket wafers using ceria CMP Compositions 1 through 8 (horizontal axis) containing various cationic polymers, as described in Example 1 herein.

Aqueous polishing slurries having a pH of about 4.3 and comprising colloidal ceria (0.4 wt %, primary mean particle size of about 60 nm) and a cationic polymer were used to separately chemically-mechanically polish silicon oxide (TEOS), silicon nitride, and polysilicon blanket wafers on a MIRRA polishing apparatus using a DOW IC1010 polishing pad, at a platen speed of about 100 rpm, a carrier speed of about 85 rpm, a down force of about 3 psi, and a slurry flow rate of 150 mL/minute; polishing time: 60 seconds. The polymers and polymer concentrations utilized in the slurries are shown in Table 1, along with observed removal rates for polishing of two wafers each of nitride, oxide and polysilicon, in Å/min. FIG. 1 provides chemical structure diagrams of selected cationic polymers, including some of the polymers that were evaluated in this Example. FIG. 2 provides a graph of the removal rates achieved with the tested slurries. In FIG. 2, the vertical axis provides the removal rate (Å/min) and the horizontal axis lists the composition number from Table 1.

TABLE 1

| Slurry | Polymer | Polymer Conc. | Removal Rates | | |
|---|---|---|---|---|---|
| | | | Nitride | Oxide | PolySi |
| 1 | PolyMADQUAT | 50 ppm | 1353 | 3240 | 1798 |
| 1 | | | 1413 | 3954 | 1763 |
| 2 | PolyDADMAC | 30 ppm | 237 | 143 | 581 |
| 2 | | | 212 | 172 | 203 |
| 3 | PEI | 20 ppm | 77 | 203 | 999 |
| 3 | | | 76 | 242 | 1156 |
| 4 | PolyAc-MADQUAT | 100 ppm | 788 | 4292 | 829 |
| 4 | | | 828 | 4207 | 729 |
| 5 | PVI-quat | 45 ppm | 869 | 181 | 1814 |
| 5 | | | 670 | 216 | 651 |
| 6 | PVP | 50 ppm | 478 | 176 | 538 |
| 6 | | | 447 | 209 | 351 |
| 7 | PolyVBTAC | 50 ppm | 419 | 104 | 1013 |
| 7 | | | 352 | 117 | 1160 |
| 8 | none | | 667 | 3885 | 467 |
| 8 | | | 653 | 4081 | 397 |

In Table 1, PolyMADQUAT refers to poly(2-methacryloyloxyethyltrimethylammonium chloride), PolyDADMAC refers to poly(diallyldimethyl ammonium chloride), PEI refers to poly(ethyleneimine), PolyAc-MADQUAT refers to poly(acrylamide/2-acryloyloxyethyltrimethyl ammonium chloride) copolymer (80:20 acrylamide:MADQUAT; 50K MW), PVI-quat refers to quaterinized poly(1-vinylimidazole) quaterinized with dimethyl sulfate, PVP refers to poly (4-vinylpyridine), and PolyVBTAC refers to poly(4-vinylbenzyltrimethyl ammonium chloride).

As is evident from the results in Table 1 and FIG. 2, only the polyMADQUAT surprisingly enhanced both the nitride and polysilicon removal rates and maintained a high oxide removal rate, such that the rates for oxide, nitride and polysilicon were each greater than 1300 Å/min. In contrast, PEI, polyDADMAC, PVP, and polyVBTAC suppressed both the nitride and oxide removal rates, while PVI-quat significantly suppressed the oxide removal rate, and polyAc-MADQUAT provided only a moderate enhancement in the nitride and polysilicon removal rates. In addition, the blanket wafer results with the polyMADQUAT composition were confirmed on pattern wafers, surprisingly providing dishing of less than 10 Å and defects of only about 30 defects/wafer when polishing pattern wafers containing a nitride/polysilicon pattern.

EXAMPLE 2

This example illustrates the effects of added salt and cationic polymer concentration on oxide, nitride and polysilicon removal rates in ceria-based CMP polishing compositions comprising quaternary methacryloyloxyalkyl ammonium polymers.

Figure 3:
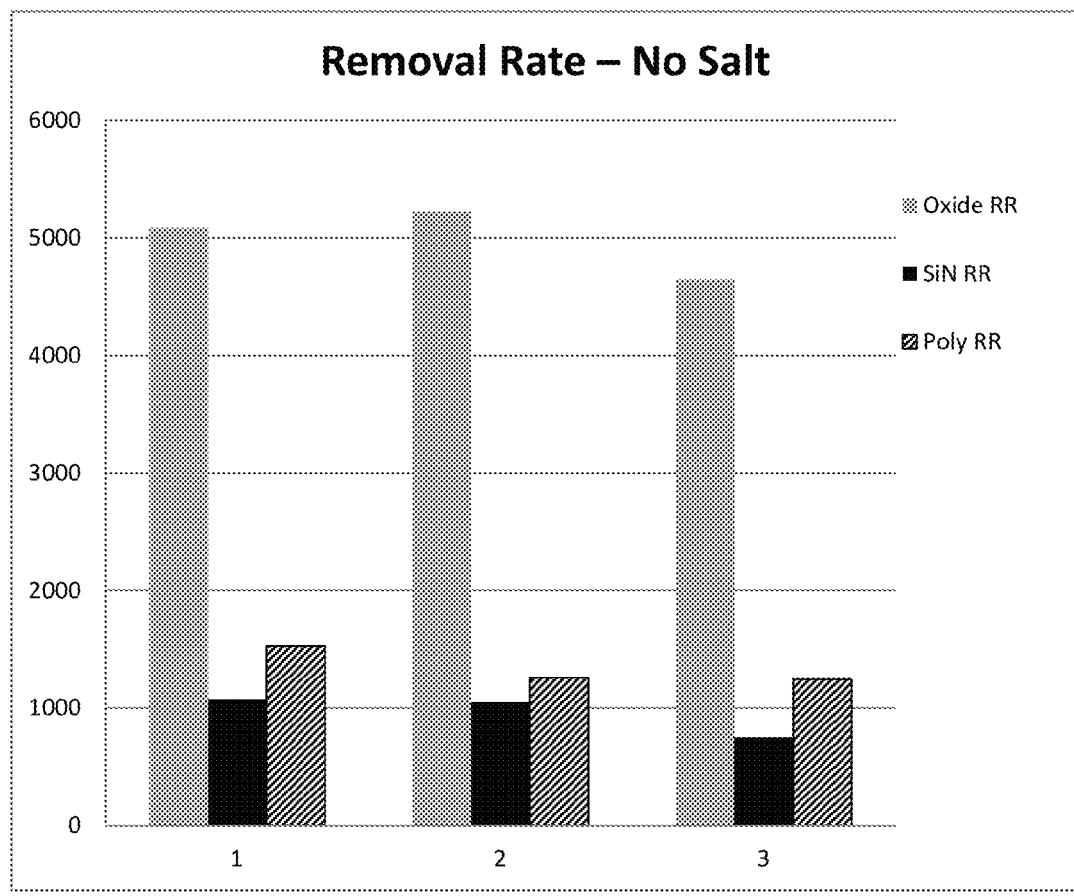
FIG. 3 provides a graph of removal rates (RR) for polishing of oxide, nitride and polysilicon blanket wafers using ceria CMP compositions without added salt.

Aqueous polishing slurries having a pH of about 4.5 and comprising colloidal ceria (0.4 wt %, primary mean particle size of about 60 nm) and a cationic polymer were used to separately chemically-mechanically polish silicon oxide (TEOS), silicon nitride, and polysilicon blanket wafers on a MIRRA polishing apparatus using a DOW IC1010 polishing pad, at a platen speed of about 100 rpm, a carrier speed of about 85 rpm, a down force of about 3 psi, and a slurry flow rate of 150 mL/minute; polishing time: 60 seconds. The polymers utilized in the slurries are shown in Table 2. The slurry corresponding to Composition 1 had a polymer concentration of about 15 ppm, the slurry corresponding to Composition 2 had a polymer concentration of about 17 ppm, and the slurry corresponding to Composition 3 had a polymer concentration of about 21 ppm. FIG. 3 provides a graph of the removal rates achieved with the tested slurries. In FIG. 3, the vertical axis provides the removal rate (Å/min) and the horizontal axis lists the composition number from Table 2.

TABLE 2

| Slurry | Polymer |
|---|---|
| 1 | PolyMADQUAT (Polymer 1 in FIG. 1) |
| 2 | Poly(2-hydroxy-3-methacryloxypropyltrimethyl ammonium chloride) (Polymer 3 in FIG. 1) |
| 3 | Poly(3-chloro-2-hydroxypropyl-2-methacryloxyethyldimethyl ammonium chloride) (Polymer 2 in FIG. 1) |

Figure 4:
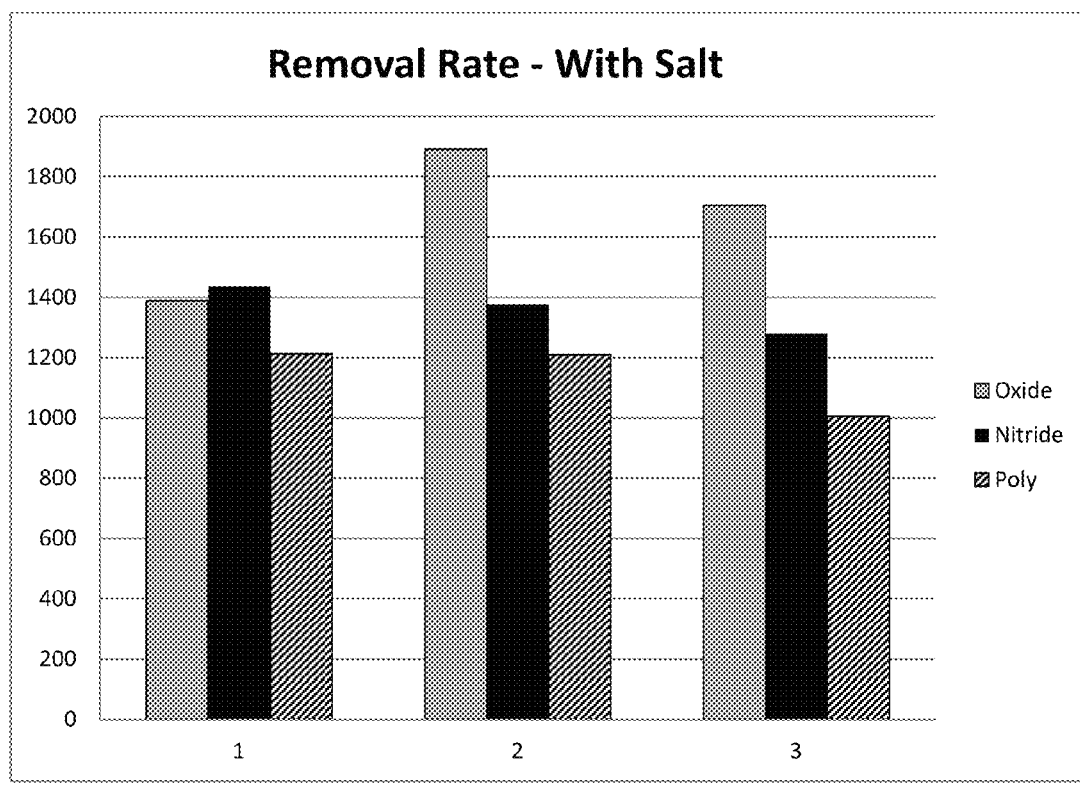
FIG. 4 provides a graph of removal rates (RR) for polishing of oxide, nitride and polysilicon blanket wafers using ceria CMP compositions with added salt.

Aqueous polishing slurries similar to those in Table 2, but also including about 900 ppm of ammonium nitrate salt and higher polymer concentrations, were tested under the same polishing conditions. FIG. 4 provides a graph of the removal rates achieved with the tested slurries. In FIG. 4, the vertical axis provides the removal rate (A/min) and the horizontal axis lists the corresponding composition number from Table 2. In the slurries that included added salt, the slurry corresponding to Composition 1 had a polymer concentration of about 25 ppm, the slurry corresponding to Composition 2 had a polymer concentration of about 29 ppm, and the slurry corresponding to Composition 3 had a polymer concentration of about 35 ppm.

As is evident form the results shown in FIG. 3 and FIG. 4, addition of the salt suppresses the oxide removal rates to levels closer to those observed for the nitride and polysilicon removal.

Figure 5:
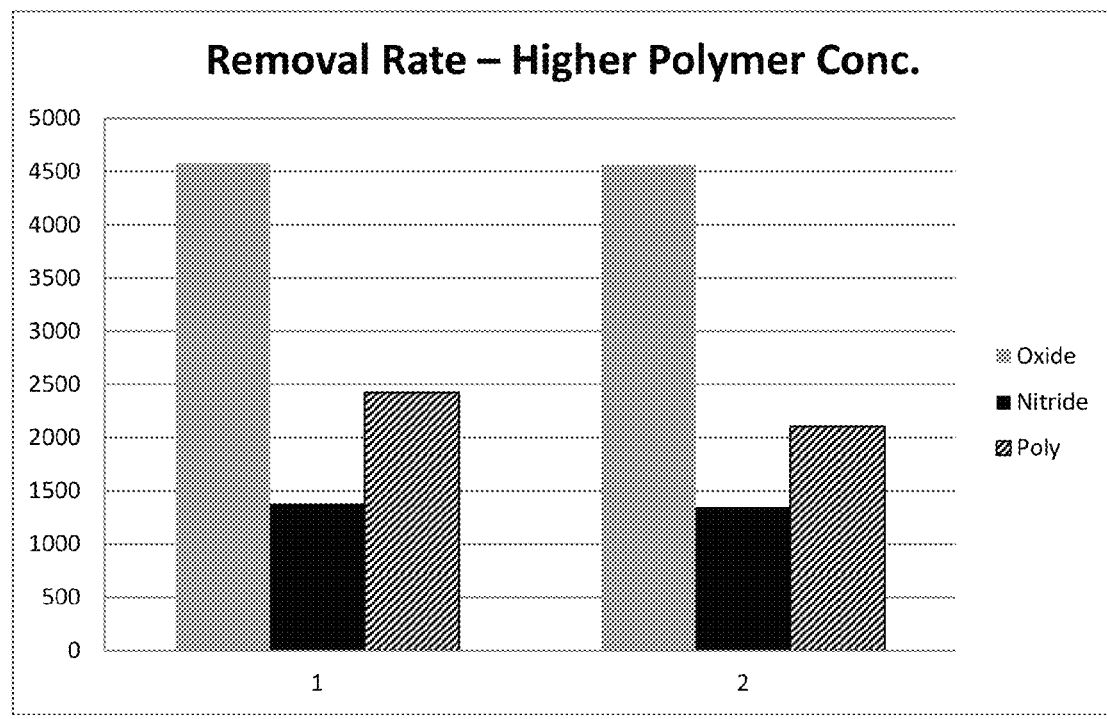
FIG. 5 provides a graph of removal rates (RR) for polishing of oxide, nitride and polysilicon blanket wafers using ceria CMP compositions without added salt and with higher polymer concentration than the examples in FIG. 3.

The removal rates for nitride and polysilicon also can be enhanced by increasing the polymer concentration. FIG. 5 provides removal rates for slurries similar to Compositions 1 and 2 in Table 2, except that the polymer concentration for Composition 1 was increased to 55 ppm and the polymer concentration for Composition 2 was increased to 65 ppm. No salt was added to these slurries.

Based on the information in FIGS. 3, 4, and 5, the methods described herein can be manipulated to tailor the desired removal rates by adjustments of the polymer, the polymer concentration, and use of an added salt such as ammonium nitrate.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All numerical values obtained by measurement (e.g., weight, concentration, physical dimensions, removal rates, flow rates, and the like) are not to be construed as absolutely precise numbers, and should be considered to encompass values within the known limits of the measurement techniques commonly used in the art, regardless of whether or not the term "about" is explicitly stated. All methods described herein can be performed in any suitable order unless otherwise indicated herein or otherwise clearly contradicted by context. The use of any and all examples, or exemplary language (e.g., "such as") provided herein, is intended merely to better illuminate certain aspects of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

We claim:

1. A chemical mechanical polishing (CMP) method for polishing a substrate comprising silicon dioxide, silicon nitride, and polysilicon; the method comprising abrading a surface of the substrate with a CMP composition to remove at least a portion of the substrate to polish the substrate; the CMP composition comprising a particulate ceria abrasive suspended in an aqueous carrier having a pH of about 3 to about 9.5, and containing a cationic polymer; wherein the cationic polymer consists of a quaternary methacryloyloxyalkyl ammonium polymer; and wherein ceria abrasive is present in the CMP composition at a concentration of about 0.1 to about 2 percent by weight (wt %), and the cationic polymer is present in the CMP composition at a concentration of about 20 to about 200 parts-per-million (ppm) by weight, wherein the aqueous carrier further comprises ammonium nitrate.

2. The method of claim 1 wherein the particulate ceria abrasive comprises a colloidal ceria.

3. The method of claim 1 wherein the particulate ceria abrasive has a mean particle size of about 10 nm to about 200 nm.

4. The method of claim 1 wherein the cationic polymer includes one or more counter-ions selected from the group consisting of a halide, nitrate, and methylsulphate.

5. The method of claim 1 wherein the abrading is accomplished in conjunction with a polishing pad in a CMP polishing apparatus.

6. The method of claim 1 wherein the pH is about 3 to 5.

7. The method of claim 1 wherein the cationic polymer consists of at least one polymer selected from the group consisting of poly(2-methacryloyloxyethyltrimethyl ammonium chloride), poly(2-hydroxy-3-methacryloxypropyltrimethyl ammonium chloride), and poly(3-chloro-2-hydroxypropyl-2-methacryloxyethyldimethyl ammonium chloride).

\* \* \* \* \*